US011652273B2

(12) United States Patent
Liu et al.

(10) Patent No.: US 11,652,273 B2
(45) Date of Patent: May 16, 2023

(54) INNOVATIVE AIR GAP FOR ANTENNA FAN OUT PACKAGE

(71) Applicant: MediaTek Inc., Hsin-Chu (TW)

(72) Inventors: Nai-Wei Liu, Hsin-Chu (TW); Yen-Yao Chi, Hsin-Chu (TW); Yeh-Chun Kao, Hsin-Chu (TW); Shih-Huang Yeh, Hsin-Chu (TW); Tzu-Hung Lin, Hsin-Chu (TW); Wen-Sung Hsu, Hsin-Chu (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 17/676,102

(22) Filed: Feb. 18, 2022

(65) Prior Publication Data

US 2022/0173497 A1 Jun. 2, 2022

Related U.S. Application Data

(62) Division of application No. 16/387,306, filed on Apr. 17, 2019, now abandoned.
(Continued)

(51) Int. Cl.
*H01Q 1/22* (2006.01)
*H01Q 1/38* (2006.01)
(Continued)

(52) U.S. Cl.
CPC ....... *H01Q 1/2283* (2013.01); *H01L 23/5384* (2013.01); *H01L 23/5386* (2013.01);
(Continued)

(58) Field of Classification Search
CPC ...... H01Q 1/2283; H01Q 1/38; H01Q 21/065; H01Q 9/0407; H01Q 9/285; H01Q 9/065;
(Continued)

(56) References Cited

U.S. PATENT DOCUMENTS

| 8,120,539 B2 | 2/2012 | Hong et al. | |
| 8,407,890 B2 * | 4/2013 | Tang | H01Q 9/0407 |
| | | | 29/841 |

(Continued)

FOREIGN PATENT DOCUMENTS

| CN | 1298204 A | 6/2001 |
| CN | 101213663 A | 7/2008 |

(Continued)

OTHER PUBLICATIONS

Extended European Search Report dated Oct. 21, 2019 in connection with European Application No. 19173046.4.
(Continued)

*Primary Examiner* — Thai Pham
(74) *Attorney, Agent, or Firm* — Wolf, Greenfield & Sacks, P.C.

(57) ABSTRACT

A semiconductor package structure is provided. The semiconductor package structure includes a redistribution layer (RDL) structure formed on a non-active surface of a semiconductor die. An antenna structure includes a first antenna element formed in the RDL structure, a first insulating layer covering the RDL structure, a second insulating layer formed on the first insulating layer, and a second antenna element formed on and in direct contact with the second insulating layer.

17 Claims, 6 Drawing Sheets

Related U.S. Application Data

(60) Provisional application No. 62/670,922, filed on May 14, 2018.

(51) Int. Cl.

| | | |
|---|---|---|
| *H01L 23/00* | (2006.01) | |
| *H01L 23/538* | (2006.01) | |
| *H01L 23/66* | (2006.01) | |
| *H01Q 9/28* | (2006.01) | |
| *H01L 23/31* | (2006.01) | |

(52) U.S. Cl.
CPC .......... *H01L 23/5389* (2013.01); *H01L 23/66* (2013.01); *H01L 24/20* (2013.01); *H01Q 1/38* (2013.01); *H01Q 9/285* (2013.01); *H01L 23/3128* (2013.01); *H01L 2223/6677* (2013.01); *H01L 2224/211* (2013.01); *H01L 2224/215* (2013.01); *H01L 2224/221* (2013.01); *H01L 2924/01029* (2013.01)

(58) Field of Classification Search
CPC ................. H01L 23/66; H01L 23/5389; H01L 23/5384
See application file for complete search history.

(56) References Cited

U.S. PATENT DOCUMENTS

| | | | |
|---|---|---|---|
| 8,816,906 B2 | 8/2014 | Kamgaing et al. | |
| 8,866,292 B2* | 10/2014 | Beer ....................... | H01L 24/19 257/734 |
| 8,890,284 B2 | 11/2014 | Kilger et al. | |
| 8,952,521 B2 | 2/2015 | Wojnowski et al. | |
| 9,007,273 B2 | 4/2015 | Liao et al. | |
| 9,088,072 B2 | 7/2015 | Takaki et al. | |
| 9,935,065 B1 | 4/2018 | Baheti et al. | |
| 9,953,936 B2 | 4/2018 | Chen et al. | |
| 10,157,834 B1 | 12/2018 | Tang et al. | |
| 10,468,355 B2 | 11/2019 | Wu et al. | |
| 10,483,617 B2 | 11/2019 | Chuang et al. | |
| 10,510,693 B2 | 12/2019 | Wu et al. | |
| 10,629,539 B2 | 4/2020 | Liang et al. | |
| 10,636,753 B2 | 4/2020 | Marimuthu et al. | |
| 10,685,924 B2 | 6/2020 | Lasiter et al. | |
| 10,770,795 B2 | 9/2020 | Wang et al. | |
| 10,868,353 B2 | 12/2020 | Lu et al. | |
| 11,024,954 B2 | 6/2021 | Liu et al. | |
| 11,043,730 B2 | 6/2021 | Liu et al. | |
| 2006/0092079 A1 | 5/2006 | de Rochemont | |
| 2007/0029667 A1 | 2/2007 | Fujii et al. | |
| 2014/0035097 A1 | 2/2014 | Lin et al. | |
| 2015/0340765 A1 | 11/2015 | Dang et al. | |
| 2016/0104940 A1 | 4/2016 | Wang et al. | |
| 2016/0218072 A1 | 7/2016 | Liao et al. | |
| 2016/0329299 A1 | 11/2016 | Lin et al. | |
| 2017/0033468 A1 | 2/2017 | Wong | |
| 2017/0040266 A1* | 2/2017 | Lin ..................... | H01L 23/5385 |
| 2017/0140266 A1 | 5/2017 | Wang et al. | |
| 2017/0345761 A1 | 11/2017 | Yu et al. | |
| 2017/0346185 A1* | 11/2017 | Wang .................. | H01Q 1/2283 |
| 2018/0025999 A1 | 1/2018 | Yu et al. | |
| 2018/0034134 A1 | 2/2018 | Dalmia | |
| 2018/0166405 A1 | 6/2018 | Chiang et al. | |
| 2018/0247905 A1* | 8/2018 | Yu ....................... | H01L 23/3114 |
| 2018/0331041 A1 | 11/2018 | Liao et al. | |
| 2019/0027449 A1 | 1/2019 | Wan et al. | |
| 2019/0035737 A1 | 1/2019 | Wu et al. | |
| 2019/0069829 A1 | 3/2019 | Bulut | |
| 2019/0096828 A1 | 3/2019 | Wu et al. | |
| 2019/0096829 A1 | 3/2019 | Tang et al. | |
| 2019/0103652 A1 | 4/2019 | Chuang et al. | |
| 2019/0139897 A1 | 5/2019 | Liang et al. | |
| 2019/0181096 A1 | 6/2019 | Wu et al. | |
| 2019/0181104 A1 | 6/2019 | Chen et al. | |
| 2019/0348747 A1 | 11/2019 | Liu et al. | |
| 2019/0348748 A1* | 11/2019 | Liu ......................... | H01Q 1/38 |
| 2019/0348756 A1* | 11/2019 | Liu ......................... | H01Q 9/16 |
| 2020/0220250 A1 | 7/2020 | Chih et al. | |
| 2020/0258799 A1 | 8/2020 | Chiang et al. | |
| 2021/0273317 A1* | 9/2021 | Liu ......................... | H01Q 9/16 |

FOREIGN PATENT DOCUMENTS

| | | |
|---|---|---|
| CN | 102753640 A | 10/2012 |
| CN | 106711131 A | 5/2017 |
| CN | 107792828 A | 3/2018 |
| CN | 109585387 A | 4/2019 |
| EP | 3091571 A2 | 11/2016 |
| EP | 3413347 A1 | 12/2018 |
| TW | 201906233 A | 2/2019 |
| WO | WO 2015/088486 A1 | 6/2015 |
| WO | WO 2018/004684 A1 | 1/2018 |

OTHER PUBLICATIONS

Extended European Search Report dated Oct. 30, 2019 in connection with European Application No. 19173166.0.
Extended European Search Report dated Nov. 5, 2019 in connection with European Application No. 19173432.6.

* cited by examiner

INNOVATIVE AIR GAP FOR ANTENNA FAN OUT PACKAGE

CROSS REFERENCE TO RELATED APPLICATIONS

This application is a Division of U.S. application Ser. No. 16/387,306, filed Apr. 17, 2019, entitled "INNOVATIVE AIR GAP FOR ANTENNA FAN OUT PACKAGE", which claims the benefit of U.S. Provisional Application No. 62/670,922 filed on May 14, 2018, entitled "INNOVATIVE AIR GAP FOR ANTENNA FAN OUT PACKAGE," the entireties of which are incorporated by reference herein.

BACKGROUND OF THE INVENTION

Field of the Invention

The present invention relates to a semiconductor package structure, and in particular to an antenna structure in a fan-out semiconductor package.

Description of the Related Art

In order to ensure the continued miniaturization and multi-functionality of electronic products and communication devices, semiconductor packages must be small in size, support multi-pin connection, operate at high speeds, and have high functionality. Additionally, in a high-frequency application such as a radio frequency (RF) system-in-package (SiP) assembly, antennas are typically used for enabling wireless communication.

When wireless communication packages with antennas are constructed, package designs need to provide good antenna properties (such as high efficiency, wide bandwidth, etc.) while providing reliable and low-cost packaging solutions. In such a conventional SiP structure, a discrete antenna component is individually encapsulated or mounted on a printed circuit board (PCB). Since the PCB is required to provide additional area for the antenna component to be mounted thereon, it is difficult to reduce the size of the semiconductor device.

In recent years, antenna-in-package (AiP) technology that implements an antenna (or antennas) integrated into a semiconductor package has been developed for reduction of the device size. However, AiP technology still faces many challenges, and therefore an improved antenna structure integrated into semiconductor package is desired.

BRIEF SUMMARY OF THE INVENTION

Semiconductor package structures are provided. An exemplary embodiment of a semiconductor package structure includes a semiconductor die and a first redistribution layer (RDL) structure formed on a non-active surface of the semiconductor die. The semiconductor package structure further includes an antenna structure that includes a first antenna element formed in the first RDL structure, a first insulating layer covering the first RDL structure, a second insulating layer formed on the first insulating layer, and a second antenna element formed on and in direct contact with the second insulating layer.

Another exemplary embodiment of a semiconductor package structure includes a semiconductor die and a first RDL structure formed on a first surface of the semiconductor die. The semiconductor package structure further includes a first molding compound layer covering the first RDL structure and having a first air-gap opening passing through the first molding compound layer. The semiconductor package structure further includes an insulating layer formed on the first molding compound layer and capping the first air-gap opening. The semiconductor package structure further includes a patch antenna that includes a first antenna element formed in the first RDL structure and directly below the first air-gap opening, and a second antenna element formed on the insulating layer and directly above the first air-gap opening.

Yet another exemplary embodiment of a semiconductor package structure includes a semiconductor die and a first RDL structure formed on a first surface of the semiconductor die. The semiconductor package structure further includes a first molding compound layer covering the first RDL structure and a first insulating filler passing through the first molding compound layer. The semiconductor package structure further includes an insulating layer formed on the first molding compound layer and capping the first insulating filler. The semiconductor package structure further includes a patch antenna that includes a first antenna element formed in the first RDL structure and directly below the first insulating filler, and a second antenna element formed on the insulating layer and directly above the first insulating filler.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
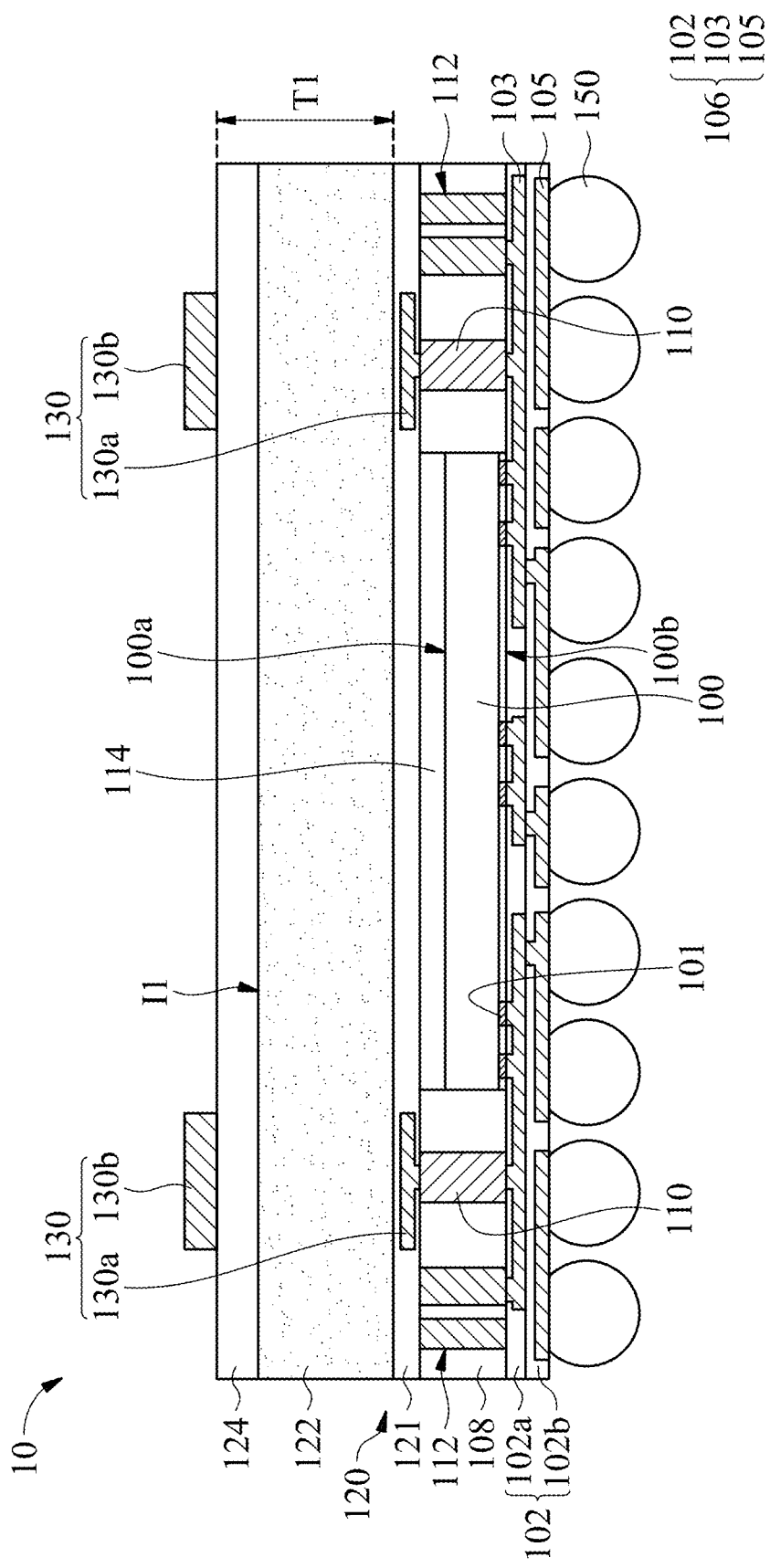
FIG. 1 is a cross-sectional view of an exemplary semiconductor package structure in accordance with some embodiments.

The following description is of the best-contemplated mode of carrying out the invention. This description is made for the purpose of illustrating the general principles of the invention and should not be taken in a limiting sense. The scope of the invention is determined by reference to the appended claims.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

FIG. 1 is a cross-sectional view of an exemplary semiconductor package structure 10 in accordance with some embodiments. In some embodiments, the semiconductor package structure 10 is a wafer-level semiconductor package structure, and is a flip-chip semiconductor package structure. As shown in FIG. 1, the semiconductor package structure 10 is mounted on a base (not shown), in accordance with some embodiments. For example, the semiconductor package structure may be a system-on-chip (SOC) package structure. Moreover, the base may include a printed circuit board (PCB) and may be made of polypropylene (PP).

Alternatively, the base is a package substrate and the semiconductor package structure 10 is mounted onto the base by a bonding process. In some embodiments, the semiconductor package structure 10 includes conductive structures 150 that are mounted on and electrically coupled to the base by the bonding process. Each of the conductive structures 150 may include a conductive bump structure such as a copper bump or a solder bump structure, as shown in FIG. 1. Alternatively, each of the conductive structures 150 includes a conductive pillar structure, a conductive wire structure, or a conductive paste structure.

In some embodiments, the semiconductor package structure 10 further includes a semiconductor die 100, such as a system-on-chip (SOC) die. For example, the SOC die may include a microcontroller (MCU), a microprocessor (MPU), a power management integrated circuit (PMIC), a global positioning system (GPS) device, a radio frequency (RF) device, or any combination thereof. It should be noted that the number of semiconductor dies integrated in the semiconductor package structure 10 is not limited to what is disclosed in the embodiment.

In some embodiments, the semiconductor die 100 has a first side and a second side opposite to the first side. More specifically, the first side of the semiconductor die 100 has a non-active surface 100a (which is also referred to as a rear surface) and the second side of the semiconductor die 100 has an active surface 100b (which is also referred to as a front surface) opposite the non-active surface 100a. Pads 101 of the semiconductor die 100 are disposed on the active surface 100b and electrically connected to the circuitry (not shown) of the semiconductor die 100.

In some embodiments, the semiconductor package structure 10 further includes a molding compound layer 108 surrounds the semiconductor die 100. In some embodiments, the molding compound layer 108 may be made of an epoxy, a resin, a moldable polymer, or the like. The molding compound layer 108 may be applied while substantially liquid, and then may be cured through a chemical reaction, such as in an epoxy or resin. In some other embodiments, the molding compound layer 108 may be an ultraviolet (UV) or thermally cured polymer applied as a gel or malleable solid capable of being disposed around the semiconductor die 100, and then may be cured through a UV or thermal curing process. The molding compound layer 108 may be cured with a mold (not shown).

In some embodiments, the semiconductor package structure 10 further includes a redistribution layer (RDL) structure 106 formed on the active surface 100b of the semiconductor die 100 and covering the bottom of the molding compound layer 108. The RDL structure 106 is also referred to as a fan-out structure. The RDL structure 106 is electrically connected thereto through the pads 101 of the semiconductor die 100. Moreover, the conductive structures 150 are mounted on and electrically coupled to the RDL structure 106, so that the conductive structures 150 are separated from the molding compound layer 108 and the semiconductor die 100 through the RDL structure 106. As a result, the conductive structures 150 are free from contact with the molding compound layer 108 and the semiconductor die 100.

In some embodiments, the RDL structure 106 includes one or more conductive traces disposed in an inter-metal dielectric (IMD) layer 102. More specifically, in some embodiments, conductive traces 103 are disposed at a first layer-level of the IMD layer 102 and at least one of the conductive traces 103 is electrically coupled to the semiconductor die 100. Moreover, conductive traces 105 are disposed at a second layer-level that is different from the first layer-level of the IMD layer 102. Moreover, at least one of the conductive traces 105 is electrically coupled to one or more conductive structures 150, so that the conductive structures 150 are electrically coupled to the semiconductor die 100 via the RDL structure 106.

In some embodiments, the IMD layer 102 includes a first sub-dielectric layer 102a and a second sub-dielectric layer 102b successively stacked from the active surface 100b of the semiconductor die 100, so that the conductive traces 103 are formed in the first sub-dielectric layer 102a, and the conductive traces 105 are formed in the second sub-dielectric layer 102b. It should be noted that the number of conductive traces and the number of sub-dielectric layers of the RDL structure 106 shown in FIG. 1 are only an example and are not a limitation to the present invention.

In some embodiments, the IMD layer 102 is made of an organic material, which includes a polymer base material, a non-organic material, which includes silicon nitride ($SiN_x$), silicon oxide ($SiO_x$), graphene, or the like. For example, the first sub-dielectric layers 102a and the second sub-dielectric layer 102b are made of a polymer base material. In some other embodiments, the IMD layer 102 is a high-k dielectric layer (k is the dielectric constant of the dielectric layer). In some other embodiments, the IMD layer 102 may be made of a photo sensitive material, which includes a dry film photoresist, or a taping film.

In some embodiments, the semiconductor package structure 10 further includes one or more through via structures 110 (which are sometimes referred to as through insulator vias (TIVs)) formed in and passing through the molding compound layer 108. The through via structures 110 are electrically coupled to the conductive traces 103 of the RDL structure 106 and may be made of copper.

In some embodiments, the semiconductor package structure 10 further includes an RDL structure 120 formed on the non-active surface 100a of the semiconductor die 100 and covering the top of the molding compound layer 108. The RDL structure 120 may have a structure similar to the RDL structure 106 and is also referred to as a fan-out structure. In some embodiments, the non-active surface 100a of the semiconductor die 100 is adhered to the RDL structure 120 via an adhesion layer 114 (which is sometimes referred to as a die attach film), so that the semiconductor die 100 and the molding compound layer 108 surrounding the semiconductor die 100 are interposed between the RDL structure 106 and the RDL structure 120.

In some embodiments, the RDL structure 120 is disposed on the molding compound layer 108 and the semiconductor die 100. Moreover, the RDL structure 120 includes an IMD layer 121 and conductive traces (not shown) in the IMD layer 121. The IMD layer 121 may be a single layer or a multi-layer structure. The method and material used for forming the IMD layer 121 may be the same as or similar to those of the IMD layer 102. Similarly, the method and material used for forming the conductive traces of the RDL structure 120 may be the same as or similar to those of the conductive traces 103 and 105 of the RDL structure 106. In other words, the process for formation of the RDL structure 106 can be used for formation of the RDL structure 120.

In some embodiments, the semiconductor package structure 10 further includes one or more antennas 112 therein and electrically coupled to the semiconductor die 100. More specifically, in some embodiments, the antenna 112 is formed in the molding compound layer 108, and at least one of the through via structures 110 in the molding compound layer 108 is disposed between the semiconductor die 100 and the antenna 112. The antenna 112 is electrically coupled to the semiconductor die 100 via at least one of the conductive traces 103 of the RDL structure 106. In some embodiments, the antenna 112 is a dipole antenna. In some embodiments, the method and material used for forming the antenna 112 may be the same as or similar to those of the through via structure 110.

In some embodiments, the semiconductor package structure 10 further includes an antenna structure formed over and electrically coupled to the semiconductor die 100. More specifically, the antenna structure includes one or more antennas 130, such as patch antennas. Each antenna 130 (e.g., patch antenna) includes a first antenna element 130a and a second antenna element 130b that are separated from each other by an insulating stack. In some embodiments, the insulating stack in the antenna structure includes an insulating layer 122 covering the RDL structure 120 and an insulating layer 124 formed on the insulating layer 122.

In some embodiments, the first antenna element 130a of the antenna 130 is embedded in the IMD layer 121 of the RDL structure 120, so that the first antenna element 130a is formed between the molding compound layer 108 and the insulating layer 122. The second antenna element 130b of the antenna 130 is formed on and in direct contact with the insulating layer 124 that is formed on the insulating layer 122.

In some embodiments, the through via structure 110 formed in the molding compound layer 108 is electrically coupled between the first antenna element 130a and at least one of the conductive traces 103 of the RDL structure 106, so that the semiconductor die 100 is electrically coupled to the antenna 130. In some embodiments, the first antenna element 130a is made of at least one of the conductive traces in the RDL structure 120. In those cases, the method and material used for forming the first antenna element 130a may be the same as or similar to those of the conductive traces 103 and 105 in the IMD layer 102 of the RDL structure 106.

The insulating layers 122 and 124 are formed on the RDL structure 120 above the non-active surface 100a of the semiconductor die 100 and the molding compound layer 108. Therefore, the RDL structure 120 separates the semiconductor die 100 from the insulating layers 122 and 124. In some embodiments, the insulating layers 122 and 124 serve as a resonator for the patch antenna (i.e., the antenna 130). Therefore, the thickness T1 of the insulating layers 122 and 124 depends on the desired dielectric constant ($D_k$) and the desired dissipation factor ($D_f$, which is also referred to as loss tangent) for the antenna 130. In some embodiments, the thickness T1 is in a range from about 10 µm to about 100 µm.

In some embodiments, the insulating layers 122 and 124 are made of the same material and an interface I1 is formed between the insulating layers 122 and 124. In those cases, the insulating layers 122 and 124 may be made of molding compound material. Moreover, the method and material used for forming the insulating layers 122 and 124 may be the same as or similar to those of the molding compound layer 108. The insulating layers 122 and 124 form a multi-layer structure that provide better thickness control than a single insulating layer. As a result, the design flexibility of the antenna structure can be increased to obtain the desired dielectric constant ($D_k$) and the desired dissipation factor ($D_f$).

Alternatively, the insulating layers 122 and 124 are made of different materials, so as to form a hybrid or heterogeneous insulating stack. In those cases, the insulating layer 122a may be made of a molding compound material and the insulating layer 124 may be made of a polymer, such as polyimide, A Jinomoto™ Build-up Film (ABF), PolyBenzOxazole (PBO), BenzoCycloButene (BCB) or the like. Similarly, the use of a hybrid or heterogeneous insulating stack as a resonator for the patch antenna provides better thickness control. Moreover, since the different layers in the hybrid or heterogeneous insulating stack have respective dielectric constant ($D_k$) and respective dissipation factor ($D_f$), the design flexibility of the antenna structure can be further increased to obtain the desired dielectric constant ($D_k$) and the desired dissipation factor ($D_f$). Therefore, the thickness T1 of the insulating stack between the first antenna element 130a and the second antenna element 130b can be reduced without changing the operating bandwidth of the device, thereby thinning the package size.

Figure 2:
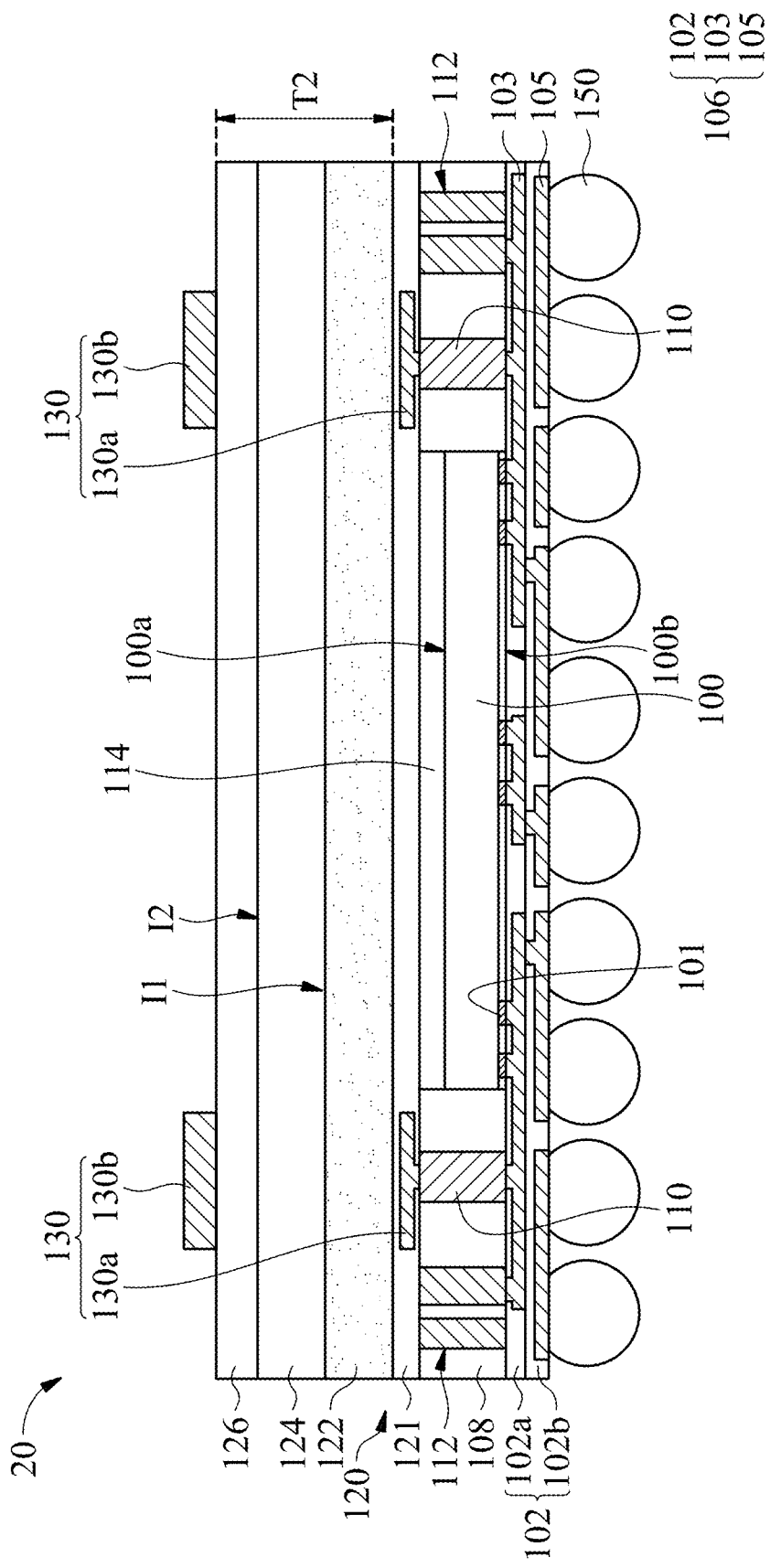
FIG. 2 is a cross-sectional view of an exemplary semiconductor package structure in accordance with some embodiments.

It should be noted that the number of insulating layers in the insulating stack between the first antenna element 130a and the second antenna element 130b is not limited to what is disclosed in the embodiment shown in FIG. 1. FIG. 2 is a cross-sectional view of an exemplary semiconductor package structure 20 in accordance with some embodiments of the disclosure. Descriptions of elements of the embodiments that are the same as or similar to those previously described with reference to FIG. 1 may hereinafter be omitted for brevity. In the embodiment, the semiconductor package structure 20 is similar to the semiconductor package structure 10 shown in FIG. 1, except that the insulating stack between the first antenna element 130a and the second antenna element 130b further includes an insulating layer 126 formed on the insulating layer 124. In some embodiments, the insulating stack including the insulating layers 122, 124 and 126 has a thickness T2 that is in a range from about 10 µm to about 100 µm. In some embodiments, the thickness T2 is substantially equal to the thickness T1 shown in FIG. 1.

In some embodiments, the insulating layers 122, 124 and 126 are made of the same material, in which an interface I1 is formed between the insulating layers 122 and 124 and an interface I2 is formed between the insulating layers 124 and 126. In those cases, the insulating layers 122, 124 and 126 may be made of molding compound material. Moreover, the method and material used for forming the insulating layers 122, 124 and 126 may be the same as or similar to those of the molding compound layer 108.

Alternatively, at least two of the insulating layers 122, 124 and 126 are made of the same or different materials, so as to form a hybrid or heterogeneous insulating stack. For example, the insulating layer 122a may be made of molding compound material, the insulating layer 124 may be made of a polymer, such as polyimide, ABF, PBO, BCB or the like, and the insulating layer 126 may be made of a polymer, such as polyimide, ABF, PBO, BCB or the like.

Figure 3:
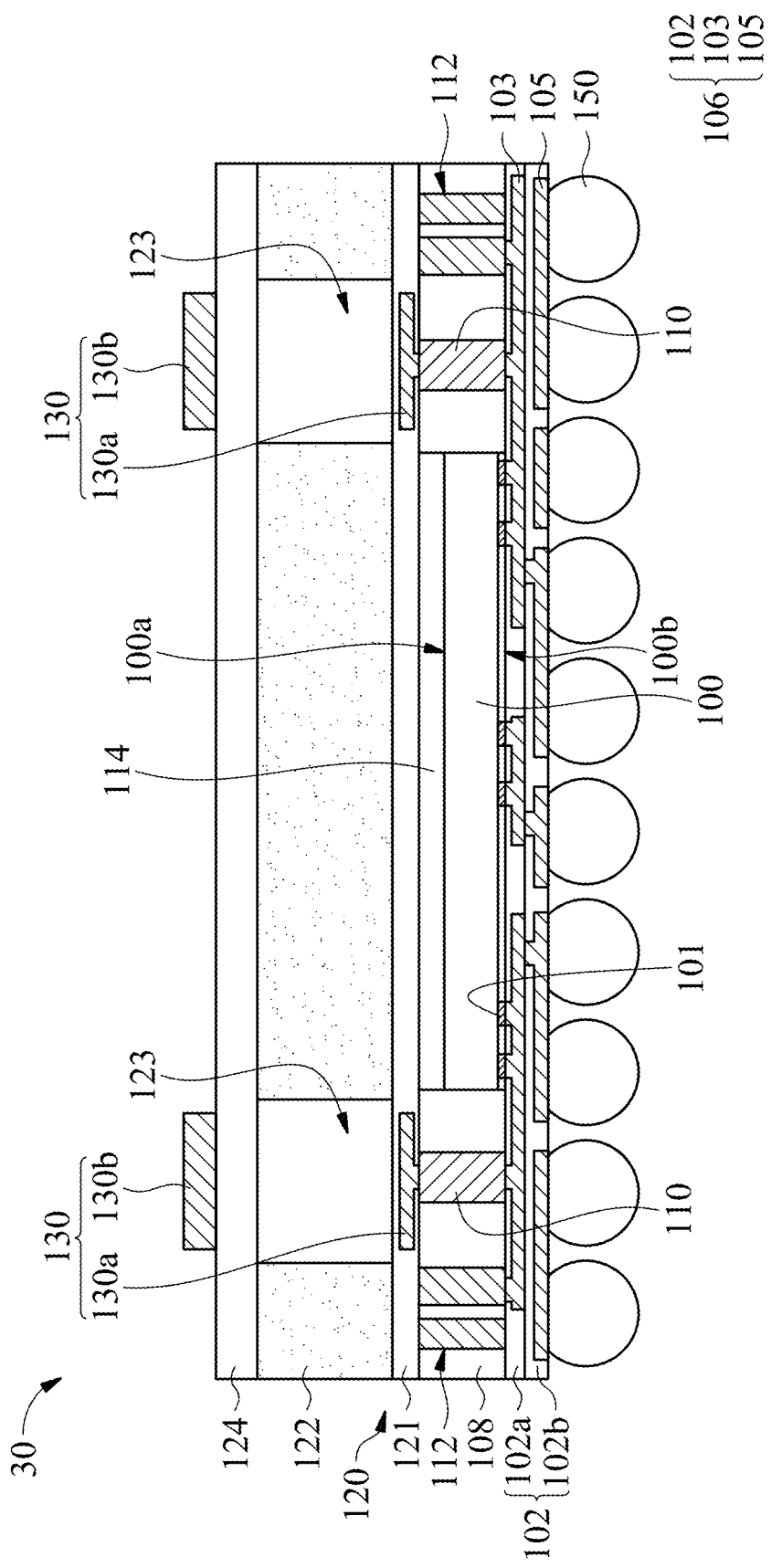
FIG. 3 is a cross-sectional view of an exemplary semiconductor package structure in accordance with some embodiments.

FIG. 3 is a cross-sectional view of an exemplary semiconductor package structure 30 in accordance with some embodiments of the disclosure. Descriptions of elements of the embodiments that are the same as or similar to those previously described with reference to FIG. 1 may hereinafter be omitted for brevity. In the embodiment, the semiconductor package structure 30 is similar to the semiconductor package structure 10 shown in FIG. 1. Unlike the semiconductor package structure 10, the insulating layer 122 in the semiconductor package structure 30 has an air-gap opening 123 passing through the insulating layer 122.

In some embodiments, the air-gap opening 123 is capped by the insulating layer 124 and corresponds to the first antenna element 130a and the second antenna element 130b, so that the first antenna element 130a is formed directly below the air-gap opening 123 and the second antenna element 130b is formed directly above the air-gap opening 123. In some embodiments, the air-gap opening 123 is a trench opening and has a shape that is substantially the same as that of the second antenna element 130b as viewed from a top-view perspective. In those cases, the width of the air-gap opening 123 may be substantially the same as or different from the width of the second antenna element 130b. For example, the width of the air-gap opening 123 may be greater than the width of the second antenna element 130b, as shown in FIG. 3. In the embodiment, the air-gap opening 123 has a dielectric constant ($D_k$) equal to 1 and a dissipation factor ($D_f$) equal to zero. Therefore, the dielectric constant ($D_k$) and the dissipation factor ($D_f$) of the insulating stack between the first antenna element 130a and the second antenna element 130b can be further reduced compared to the semiconductor package structure 10 shown in FIG. 1. As a result, the antenna efficiency can be increased and the antenna loss can be reduced.

Figure 4:
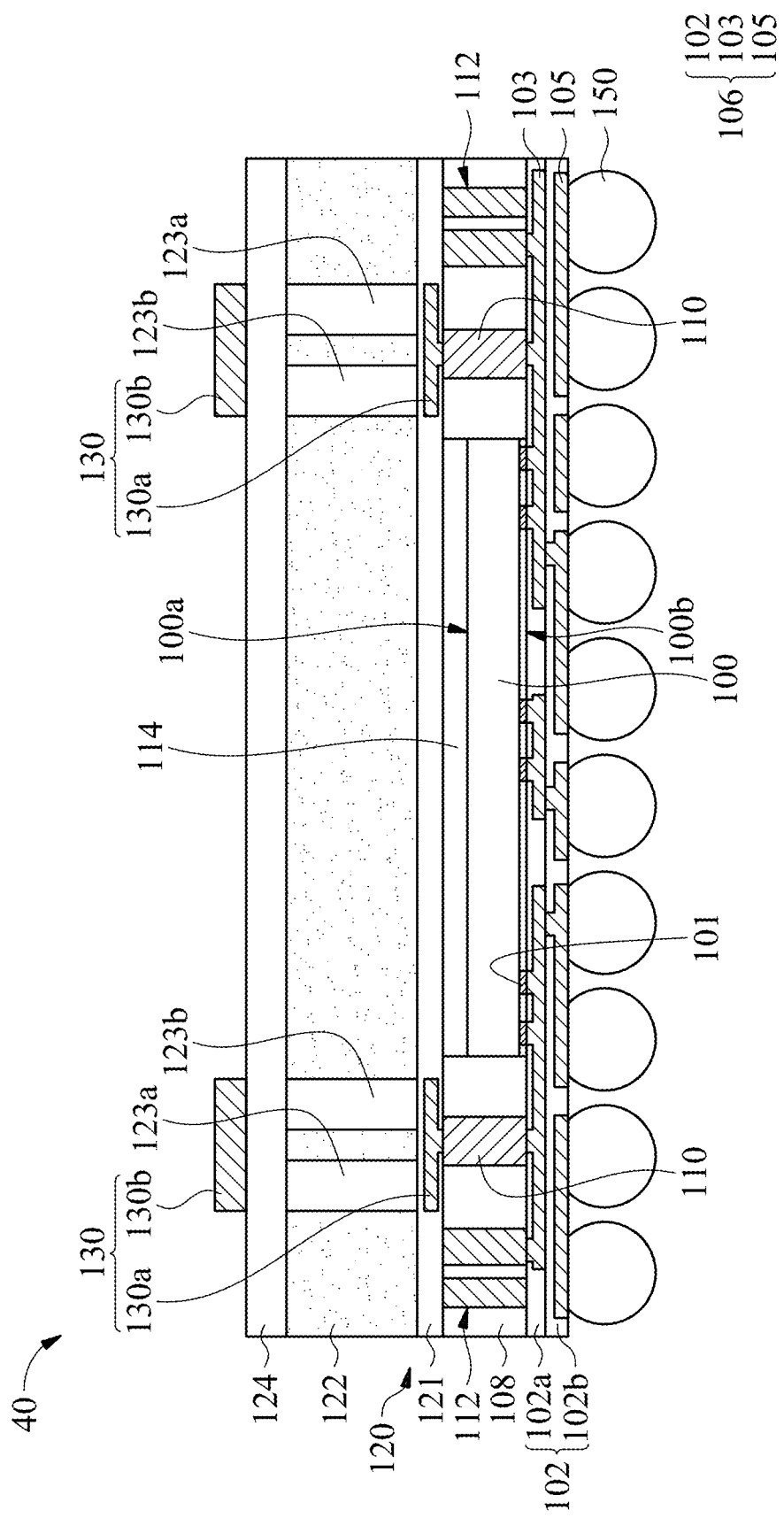
FIG. 4 is a cross-sectional view of an exemplary semiconductor package structure in accordance with some embodiments.

It should be noted that the number of air-gap openings in the insulating layer 122 is not limited to what is disclosed in the embodiment shown in FIG. 3. FIG. 4 is a cross-sectional view of an exemplary semiconductor package structure 40 in accordance with some embodiments of the disclosure. Descriptions of elements of the embodiments that are the same as or similar to those previously described with reference to FIGS. 1 and 3 and may hereinafter be omitted for brevity. In the embodiment, the semiconductor package structure 40 is similar to the semiconductor package structure 30 shown in FIG. 3, except that the insulating layer 122 in the semiconductor package structure 40 has at least two air-gap openings passing through the insulating layer 122. For example, the insulating layer 122 includes two air-gap openings 123a and 123b adjacent to each other and separated from each other by the insulating layer 122.

In some embodiments, the air-gap openings 123a and 123b are capped by the insulating layer 124 and corresponds to the first antenna element 130a and the second antenna element 130b, so that the first antenna element 130a is formed directly below the air-gap openings 123a and 123b and the second antenna element 130b is formed directly above the air-gap openings 123a and 123b. In some embodiments, the air-gap opening 123a has a shape that is substantially the same as that of the second antenna element 130b as viewed from a top-view perspective, and the air-gap opening 123b has a shape that is substantially the same as that of the air-gap opening 123a as viewed from a top-view perspective. In some embodiments, the air-gap openings 123a and 123b are via openings, trench openings, or a combination thereof.

Figure 5:
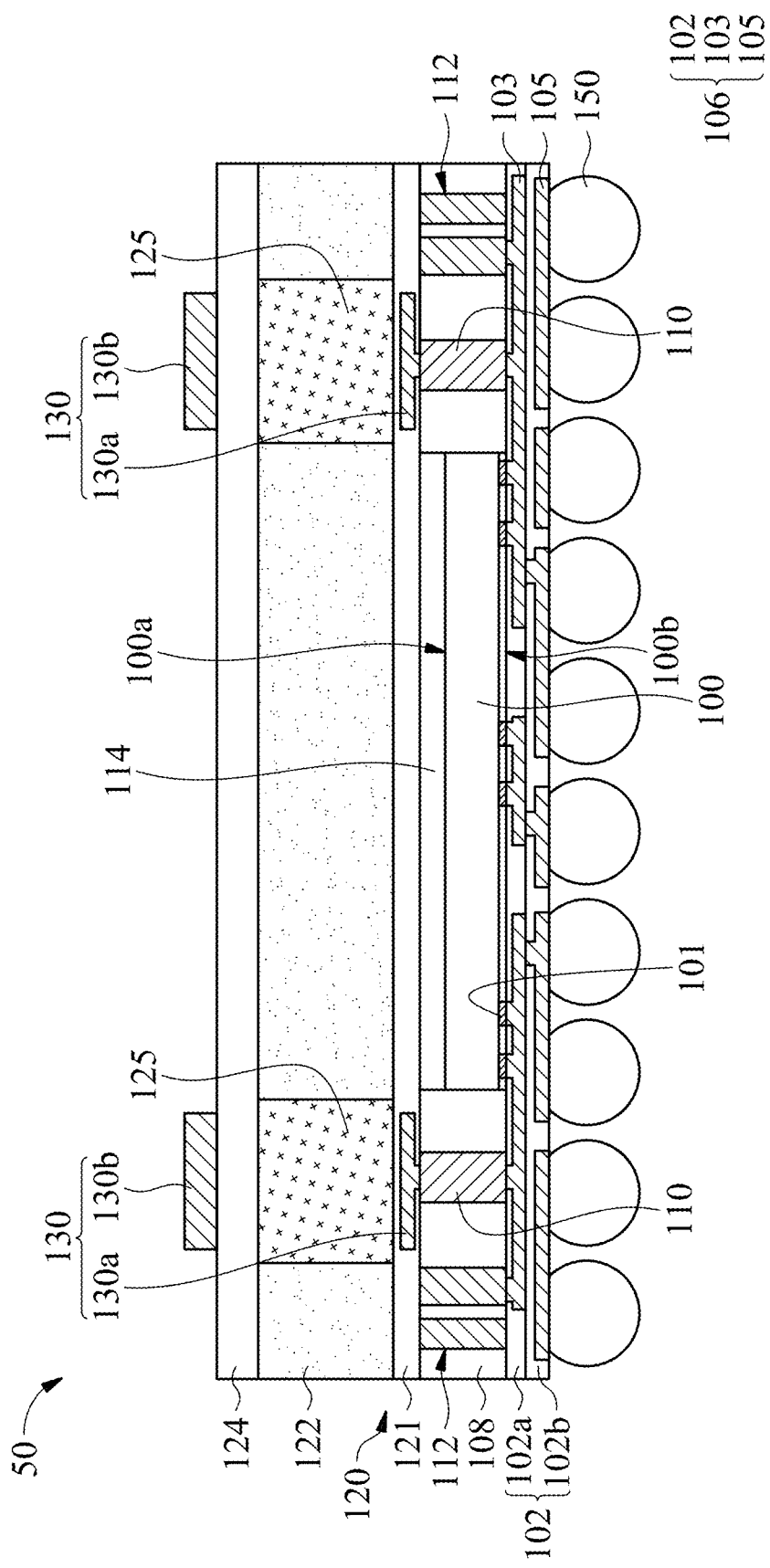
FIG. 5 is a cross-sectional view of an exemplary semiconductor package structure in accordance with some embodiments.

FIG. 5 is a cross-sectional view of an exemplary semiconductor package structure 50 in accordance with some embodiments of the disclosure. Descriptions of elements of the embodiments that are the same as or similar to those previously described with reference to FIGS. 1 and 3 may hereinafter be omitted for brevity. In the embodiment, the semiconductor package structure 50 is similar to the semiconductor package structure 30 shown in FIG. 3, except that the air-gap opening 123 shown in FIG. 3 is replaced by an insulating filler 125. Similarly, the insulating filler 125 is capped by the insulating layer 124, passes through the insulating layer 122, and corresponds to the first antenna element 130a and the second antenna element 130b, so that the first antenna element 130a is formed directly below the insulating filler 125, and the second antenna element 130b is formed directly above the insulating filler 125. In some embodiments, the insulating filler 125 is formed by filling a trench opening (not shown) with a dielectric material different from the insulating layers 122 and 124. In some embodiments, the insulating filler is made of a low-k (k is a dielectric constant value) material or a ceramic material. Similar to the air-gap openings 123 shown in FIG. 3, the insulating filler 125 has a shape that is substantially the same as that of the second antenna element 130b as viewed from a top-view perspective. In those cases, the width of the insulating filler 125 may be substantially the same as or different from the width of the second antenna element 130b. For example, the width of the insulating filler 125 may be greater than the width of the second antenna element 130b, as shown in FIG. 5. In the embodiment, the dielectric constant ($D_k$) of the hybrid or heterogeneous insulating stack including the insulating filler 125 can be further reduced compared to the semiconductor package structure 10 shown in FIG. 1. As a result, the antenna efficiency can be increased. In addition, the mechanical strength of the hybrid or heterogeneous insulating stack including the insulating filler 125 can be further increased compared to the semiconductor package structure 30 shown in FIG. 3.

Figure 6:
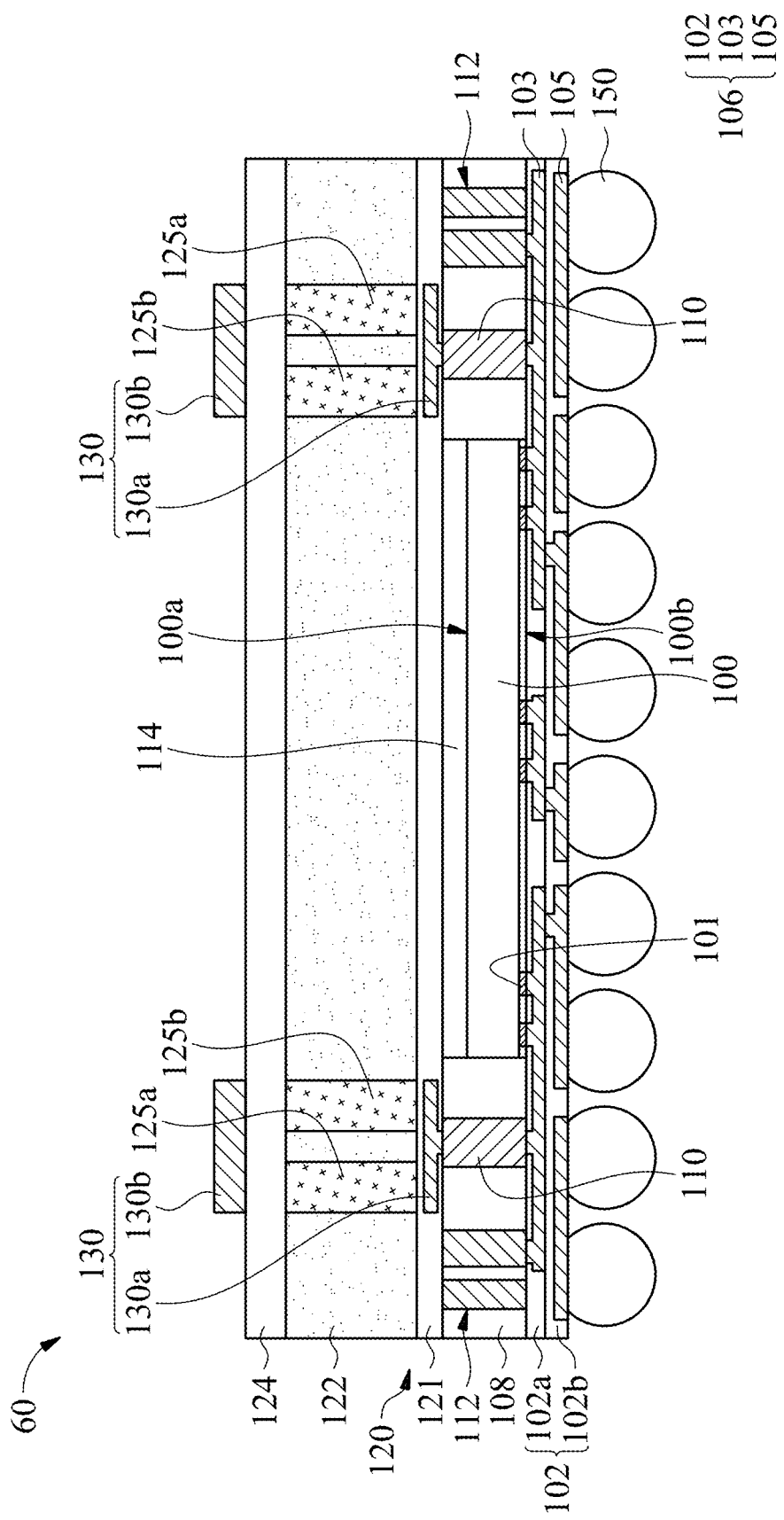
FIG. 6 is a cross-sectional view of an exemplary semiconductor package structure in accordance with some embodiments.

It should be noted that the number of insulating fillers in the insulating layer 122 is not limited to what is disclosed in the embodiment shown in FIG. 5. FIG. 6 is a cross-sectional view of an exemplary semiconductor package structure 60 in accordance with some embodiments of the disclosure. Descriptions of elements of the embodiments that are the same as or similar to those previously described with reference to FIGS. 1, 4 and 5 may hereinafter be omitted for brevity. In the embodiment, the semiconductor package structure 60 is similar to the semiconductor package structure 40 shown in FIG. 4, except that the air-gap openings 123a and 123b shown in FIG. 4 are replaced by insulating fillers, respectively. For example, the insulating layer 122 includes two insulating fillers 125a and 125b adjacent to each other and separated from each other by the insulating layer 122.

Similarly, the insulating fillers 125a and 125b are capped by the insulating layer 124, pass through the insulating layer 122, and correspond to the first antenna element 130a and the second antenna element 130b, so that the first antenna element 130a is formed directly below the insulating fillers 125a and 125b, and the second antenna element 130b is formed directly above the insulating fillers 125a and 125b. The method and material used for forming the insulating fillers 125a and 125b may be the same as or similar to those of the insulating filler 125. In some embodiments, the insulating filler 125a has a shape that is substantially the same as that of the second antenna element 130b as viewed from a top-view perspective, and the insulating filler 125b has a shape that is substantially the same as that of the insulating filler 125a as viewed from a top-view perspective.

In some embodiments, the insulating filler 125 are formed in via openings (not shown), trench openings (not shown), or a combination thereof that are formed in the insulating layer 122.

According to the foregoing embodiments, the semiconductor package structure is designed to fabricate a multi-layer insulating structure or a hybrid or heterogeneous insulating stack and antennas in the semiconductor package structure. The multi-layer insulating structure or a hybrid or heterogeneous insulating stack serves as a resonator for the patch antenna and provides better thickness control, so that the design flexibility of the antenna structure can be increased, thereby obtaining desired dielectric constant ($D_k$) and the desired dissipation factor ($D_f$). Moreover, the thickness of the resonator can be reduced without changing the operating bandwidth of the device, thereby thinning the package size.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor package structure, comprising:
   a semiconductor die;
   a first redistribution layer (RDL) structure formed on a first surface of the semiconductor die;
   a first insulating layer covering the first RDL structure and having a first air-gap opening passing through the first insulating layer;
   a second insulating layer formed on the first insulating layer and capping the first air-gap opening; and
   a patch antenna, comprising:
      a first antenna element formed in the first RDL structure and directly below the first air-gap opening; and
      a second antenna element formed on the second insulating layer and directly above the first air-gap opening.

2. The semiconductor package structure as claimed in claim 1, wherein an interface is formed between the first insulating layer and the second insulating layer, and wherein the second insulating layer is made of a material that is the same as that of the first insulating layer.

3. The semiconductor package structure as claimed in claim 1, wherein the second insulating layer is made of a material that is different from that of the first insulating layer.

4. The semiconductor package structure as claimed in claim 1, further comprising:
   a second molding compound layer surrounding the semiconductor die;
   a second RDL structure formed on a second surface of the semiconductor die and covering the second molding compound layer, wherein the second surface of the semiconductor die is opposite to the first surface of the semiconductor die;
   a dipole antenna formed in the second molding compound layer and electrically coupled to the semiconductor die via the second RDL structure; and
   a through via structure formed in the second molding compound layer and electrically coupled between the first antenna element and the second RDL structure.

5. The semiconductor package structure as claimed in claim 1, further comprising a plurality of conductive structures electrically coupled to the semiconductor die via the second RDL structure.

6. The semiconductor package structure as claimed in claim 1, wherein the first air-gap opening has a shape that is substantially the same as that of the second antenna element as viewed from a top-view perspective.

7. The semiconductor package structure as claimed in claim 1, further comprising a second air-gap opening passing through the first insulating layer and covered by the second insulating layer, wherein the first antenna element is formed directly below the second air-gap opening, and the second antenna element is formed directly above the second air-gap opening.

8. The semiconductor package structure as claimed in claim 7, wherein the second air-gap opening has a shape that is substantially the same as that of the first air-gap opening as viewed from a top-view perspective.

9. A semiconductor package structure, comprising:
   a semiconductor die;
   a first redistribution layer (RDL) structure formed on a first surface of the semiconductor die;
   a first insulating layer covering the first RDL structure;
   a first insulating filler passing through the first insulating layer;
   a second insulating layer formed on the first insulating layer and capping the first insulating filler; and
   a patch antenna, comprising:
      a first antenna element formed in the first RDL structure and directly below the first insulating filler; and
      a second antenna element formed on the second insulating layer and directly above the first insulating filler.

10. The semiconductor package structure as claimed in claim 9, wherein an interface is formed between the first insulating layer and the second insulating layer, and wherein the second insulating layer is made of a material that is the same as that of the first insulating layer.

11. The semiconductor package structure as claimed in claim 9, wherein the second insulating layer is made of a material that is different from that of the first insulating layer and that of the first insulating filler.

12. The semiconductor package structure as claimed in claim 9, wherein the first insulating filler is made of a low-k material or a ceramic material.

13. The semiconductor package structure as claimed in claim 9, further comprising:
   a second molding compound layer surrounding the semiconductor die;
   a second RDL structure formed on a second surface of the semiconductor die and covering the second molding compound layer, wherein the second surface of the semiconductor die is opposite to the first surface of the semiconductor die;
   a dipole antenna formed in the second molding compound layer and electrically coupled to the semiconductor die via the second RDL structure; and
   a through via structure formed in the second molding compound layer and electrically coupled between the first antenna element and the second RDL structure.

14. The semiconductor package structure as claimed in claim 9, further comprising a plurality of conductive structures electrically coupled to the semiconductor die via the second RDL structure.

15. The semiconductor package structure as claimed in claim 9, wherein the first insulating filler has a shape that is substantially the same as that of the second antenna element as viewed from a top-view perspective.

16. The semiconductor package structure as claimed in claim 9, further comprising a second insulating filler passing through the first insulating layer and covered by the second insulating layer, wherein the first antenna element is formed directly below the second insulating filler, and the second antenna element is formed directly above the second insulating filler.

17. The semiconductor package structure as claimed in claim 16, wherein the second insulating filler has a shape that is substantially the same as that of the first insulating filler as viewed from a top-view perspective.

* * * * *